(12) United States Patent
Lee

(10) Patent No.: US 8,193,029 B2
(45) Date of Patent: Jun. 5, 2012

(54) METHODS OF MANUFACTURING PHASE-CHANGE RANDOM ACCESS MEMORY DEVICES WITH PHASE-CHANGE NANOWIRE FORMATION USING SINGLE ELEMENT

(75) Inventor: Tae-Yon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 12/801,450

(22) Filed: Jun. 9, 2010

(65) Prior Publication Data

US 2010/0323492 A1 Dec. 23, 2010

(30) Foreign Application Priority Data

Jun. 23, 2009 (KR) .................. 10-2009-0055763

(51) Int. Cl.
*H01L 21/00* (2006.01)
*H01L 21/335* (2006.01)

(52) U.S. Cl. ......... 438/95; 438/962; 257/9; 257/E29.07; 257/E21.404; 977/762; 977/763; 977/778

(58) Field of Classification Search ..................... 438/95, 438/962; 257/9, E29.07, E21.404; 977/762, 977/763, 778

See application file for complete search history.

(56) References Cited

U.S. PATENT DOCUMENTS

| 7,771,695 B2 * | 8/2010 | Afzali-Ardakani et al. ................ 423/447.1 |
| 7,863,381 B2 * | 1/2011 | Nelson et al. ............... 525/107 |
| 7,940,554 B2 * | 5/2011 | Scheuerlein et al. ......... 365/163 |
| 7,955,981 B2 * | 6/2011 | Chen et al. .................... 438/689 |
| 7,961,494 B2 * | 6/2011 | Scheuerlein ................. 365/148 |

FOREIGN PATENT DOCUMENTS

| JP | 02-244722 | 9/1990 |
| JP | 2006-165595 | 6/2006 |
| JP | 2007-220959 | 8/2007 |

* cited by examiner

*Primary Examiner* — Thanh V Pham

(74) *Attorney, Agent, or Firm* — Harness, Dickey & Pierce, P.L.C

(57) ABSTRACT

A PRAM device includes a lower electrode, a phase-change nanowire and an upper electrode. The phase-change nanowire may be electrically connected to the lower electrode and includes a single element. The upper electrode may be electrically connected to the phase-change nanowires.

14 Claims, 15 Drawing Sheets

METHODS OF MANUFACTURING PHASE-CHANGE RANDOM ACCESS MEMORY DEVICES WITH PHASE-CHANGE NANOWIRE FORMATION USING SINGLE ELEMENT

PRIORITY STATEMENT

This application claims priority under 35USC §119 to Korean Patent Application No. 10-2009-0055763, filed on Jun. 23, 2009, in the Korean Intellectual Property Office (KIPO), the entire contents of which are herein incorporated by reference.

BACKGROUND

1. Field

Example embodiments relate to phase-change random access memory (PRAM) devices and methods of manufacturing the same. More particularly, example embodiments relate to PRAM devices including a single-element phase-change material (PCM) and methods of manufacturing the same.

2. Description of the Related Art

PRAM devices having a multi-element, e.g., germanium-antimony-tellurium (GST), PCM layer may not be reliable because the antimony of the GST PCM layer may be extracted in a repetitive operation of rewriting, e.g., crystallization, and vice versa. Thus, developing PRAM devices having more reliability is needed.

SUMMARY

Example embodiments provide PRAM devices and methods of manufacturing PRAM devices having improved reliability.

According to example embodiments, there is provided a phase-change random access memory (PRAM) device. The PRAM device may include a lower electrode, a phase-change nanowire and an upper electrode. The phase-change nanowire may include a single element and may be electrically connected to the lower electrode. The upper electrode may be electrically connected to the phase-change nanowires.

In example embodiments, the phase-change nanowire may be formed within a porous insulation layer between the lower and upper electrodes. In example embodiments, the phase-change nanowire may be formed in a pore of the porous insulation layer having a cross-section in a range of about $1\times1$ nm$^2$ to about $5\times5$ nm$^2$.

In example embodiments, the PRAM device may further include a phase-change material (PCM) layer between the porous insulation layer and the upper electrode. In example embodiments, the PCM layer may be formed integrally with the phase-change nanowire and includes the same material as that of the phase-change nanowire.

In example embodiments, the porous insulation layer may include a silsesquioxane (SSQ)-based material, a polymer having a nonpolar carbon-carbon bond, or a silica-based material. In example embodiments, the SSQ-based material may include hydrogen silsesquioxane (HSQ).

In example embodiments, the phase-change nanowire may include antimony or bismuth. In example embodiments, the PRAM device may further include a diode electrically connected to the lower electrode. In example embodiments, the phase-change nanowire may have a diameter of less than about 10 nm.

In example embodiments, the lower and upper electrodes may include at least one of a conductive material and a conductive carbon-based material. The conductive material may be at least one of titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and tantalum oxynitride.

According to example embodiments, there is provided a method of manufacturing a phase-change random access memory (PRAM) device. In the method, a lower electrode may be formed through an insulation layer. A phase-change nanowire may be formed using a single element to be electrically connected to the lower electrode. An upper electrode may be formed to be electrically connected to the phase-change nanowire.

In example embodiments, when the phase-change nanowire is formed, a porous insulation layer may be formed on the lower electrode; and the phase-change nanowire may be formed in a pore of the porous insulation layer having a cross-section in a range of about $1\times1$ nm$^2$ to about $5\times5$ nm$^2$. In example embodiments, when the phase-change nanowire is formed, an atomic layer deposition (ALD) process may be performed on the porous insulation layer using a single element. In example embodiments, the ALD process may be performed using antimony or bismuth. In example embodiments, the ALD process may be performed using Sb-(iPr)$_3$ as a precursor source gas. In example embodiments, the ALD process may be performed using argon plasma.

In example embodiments, the method may further include forming a phase-change material (PCM) layer between the porous insulation layer and the upper electrode. In example embodiments, the PCM layer may be formed integrally with the phase-change nanowire and may include the same material as that of the phase-change nanowire.

In example embodiments, forming the porous insulation layer may include forming any one selected from the group consisting of a silsesquioxane (SSQ)-based material, a polymer having a nonpolar carbon-carbon bond, and a silica-based material. In example embodiments, the SSQ-based material may include hydrogen silsesquioxane (HSQ).

In example embodiments, the method may further include forming a diode to be electrically connected to the lower electrode. In example embodiments, the phase-change nanowire may be formed to have a diameter of less than about 10 nm. In example embodiments, forming the lower and upper electrodes may include forming at least one of a conductive material and a conductive carbon-based material. In example embodiments, the conductive material may be at least one of titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and tantalum oxynitride.

According to example embodiments, a PRAM device may include a phase-change nanowire having a single element, and thus, some elements therein may not be segregated from other elements. Thus, no phase segregation may occur in the phase-change nanowire, and the PRAM device may have improved reliability. Additionally, the phase-change nanowire may have a smaller contact area with a lower electrode, and thus, a smaller current may be needed to operate the PRAM device. As a result, the PRAM device may have a higher operation speed.

BRIEF DESCRIPTION OF THE DRAWINGS

Example embodiments will be more clearly understood from the following detailed description taken in conjunction with the accompanying drawings. FIGS. 1 to 25 represent non-limiting, example embodiments as described herein.

FIG. 1 is a cross-sectional view illustrating a phase-change random access memory (PRAM) device in accordance with example embodiments;

FIG. 2 is a timing chart illustrating a method of forming the phase-change nanowire 135 and the PCM layer 130;

FIG. 4 is a photograph showing a cross-section of a porous insulation layer having phase-change nanowires including antimony therein, and a graph showing antimony and titanium in the porous insulation layer;

FIG. 5 is a graph showing changes of a resistance, a current and a voltage of the PRAM device including the phase-change nanowires when the phase of the phase-change nanowires is changed several times;

FIGS. 6 to 21 are cross-sectional views illustrating a method of manufacturing a PRAM device in accordance with example embodiments;

FIGS. 22 to 24 are cross-sectional views illustrating a method of manufacturing a PRAM device in accordance with other example embodiments; and FIG. 25 is a diagram illustrating a communication system including the PRAM device in accordance with example embodiments.

DETAILED DESCRIPTION OF EXAMPLE EMBODIMENTS

Figure 1:
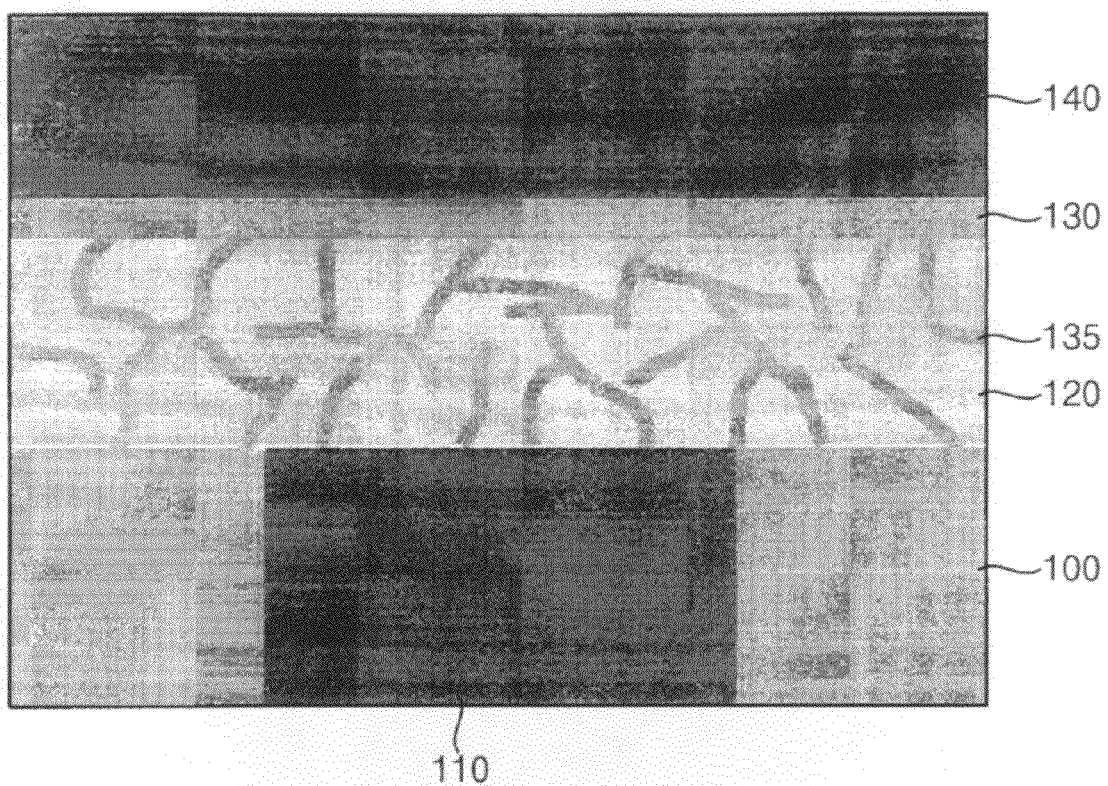

Various example embodiments will be described more fully hereinafter with reference to the accompanying drawings, in which some example embodiments are shown. The present inventive concept may, however, be embodied in many different forms and should not be construed as limited to example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as. "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

FIG. 1 is a cross-sectional view illustrating a phase-change random access memory (PRAM) device in accordance with example embodiments. Referring to FIG. 1, the PRAM device may include a lower electrode 110, a phase-change nanowire 135 and an upper electrode 140. The PRAM device may further include a porous insulation layer 120 and a phase-change material (PCM) layer 130.

The lower electrode 110 may be formed through an insulation layer 100 on a substrate (not shown). The lower electrode 110 may include a conductive material, e.g., titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and/or tantalum oxynitride, and/or a conductive carbon-based material. These may be used alone or in a combination thereof.

The porous insulation layer 120 may be formed on the insulation layer 100 and the lower electrode 110. The porous insulation layer 120 may include a silsesquioxane (SSQ)-based material, e.g., hydrogen silsesquioxane (HSQ), a polymer having a nonpolar carbon-carbon bond, or a silica-based material. The porous insulation layer 120 may include a pore having a diameter of less than about 10 nm. In example embodiments, the pore in the porous insulation layer 120 may have a cross-section of about $1\times1$ nm$^2$ to about $5\times5$ nm$^2$.

The phase-change nanowire 135 may include a single element. For example, the phase-change nanowire 135 may include antimony or bismuth. The phase-change nanowire 135 may be formed in the porous insulation layer 120, and may be electrically connected to the lower electrode 110. Particularly, the phase-change nanowire 135 may be formed in the pore of the porous insulation layer 120. The pore may have a relatively small cross-section, and thus, the phase-change nanowire 135 may also have a relatively small cross-section, e.g., in a range of about $1\times1$ nm$^2$ to about $5\times5$ nm$^2$. As a result, the phase-change nanowire 135 may have a very small contact area with the lower electrode 110, and thus, the PRAM device may have a very large current density flowing through the phase-change nanowire 135.

The PCM layer 130 may be formed integrally with the phase-change nanowire 135, and may include substantially the same material as that of the phase-change nanowire 135. The upper electrode 140 may be electrically connected to the phase-change nanowire 135. For example, the upper electrode 140 may be formed on the porous insulation layer 120, and may be electrically connected to the phase-change nanowire 125. When the PRAM device has the PCM layer 130, the upper electrode 140 may be formed on the PCM layer 130.

The upper electrode 140 may include a conductive material, e.g., titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and/or tantalum oxynitride, and/or a conductive carbon-based material. These may be used alone or in a combination thereof.

The phase-change nanowire 135 and the PCM layer 130 may include the single element, and thus, some elements therein may not be segregated from other elements. Thus, no phase segregation may occur in the phase-change nanowire 135 and the PCM layer 130, and the PRAM device may have improved reliability. Additionally, the phase-change nanowire 135 may have a smaller area in contact with the lower electrode 110, and thus, a smaller current may be needed to operate the PRAM device. As a result, the PRAM device may have a higher operation speed.

Figure 2:
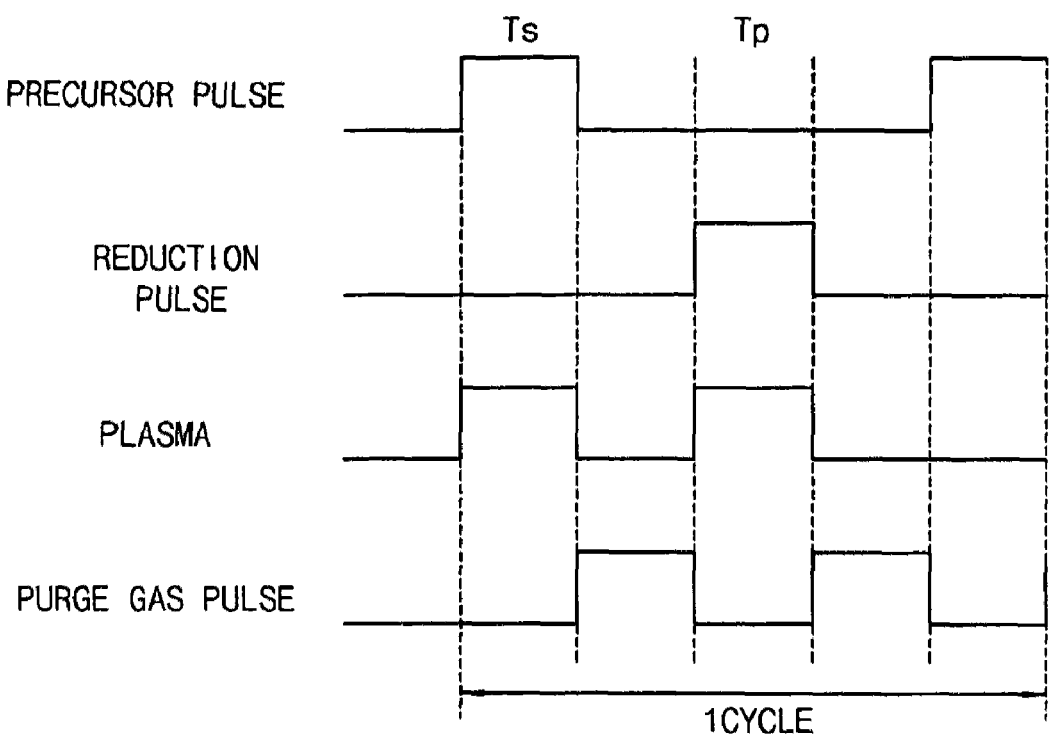

FIG. 2 is a timing chart illustrating a method of forming the phase-change nanowire 135 and the PCM layer 130. The method may include an atomic layer deposition (ALD) process as follows. Referring to FIGS. 1 and 2, during a first time period Ts, a precursor source gas and plasma may be provided into a chamber (not shown), and a phase-change layer may be formed on the porous insulation layer 120 and in the pore. of the porous insulation layer 120. The precursor source gas may include Sb-(iPr)$_3$. Examples of the precursor source gas may include Sb-(Et)$_3$, Sb-(n-Pr)$_3$, Sb-(t-Bu)$_3$ and/or Sb-(i-Bu)$_3$. A carrier gas, e.g., argon gas, may be also provided into the chamber. The chamber may have an internal temperature of about 100 to about 300° C.

After providing a purge gas into the chamber during a second time period, during a third time period Tp, a reducing agent gas, e.g., hydrogen or ammonia, and plasma may be provided into the chamber. A purge gas may be provided into the chamber again during a fourth time period. The purge gas may include argon gas, and may be provided into the chamber at a flow rate ratio of about 1000 sccm.

One cycle may include the above steps, and may be repeatedly performed to form the phase-change nanowire 135 and the PCM layer 130 in the pore and on the porous insulation layer 120, respectively. In example embodiments, about 20 to about 30 cycles may be performed, and the PCM layer 130 may be formed to have a thickness of about 10 nm. A heat treatment may be performed on the substrate, and the phase-change nanowire 135 and the PCM layer 130 may be crystallized.

Figure 3A:
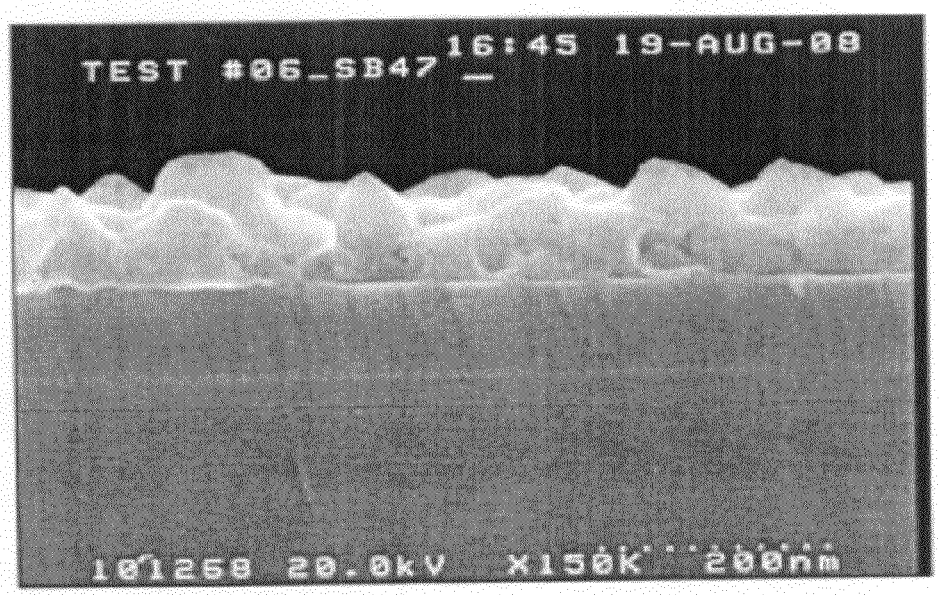
FIG. 3A is a photograph showing a cross-section of a PCM layer including antimony formed by performing 22 cycles of the above steps at a temperature of about 250° C.
Figure 3B:
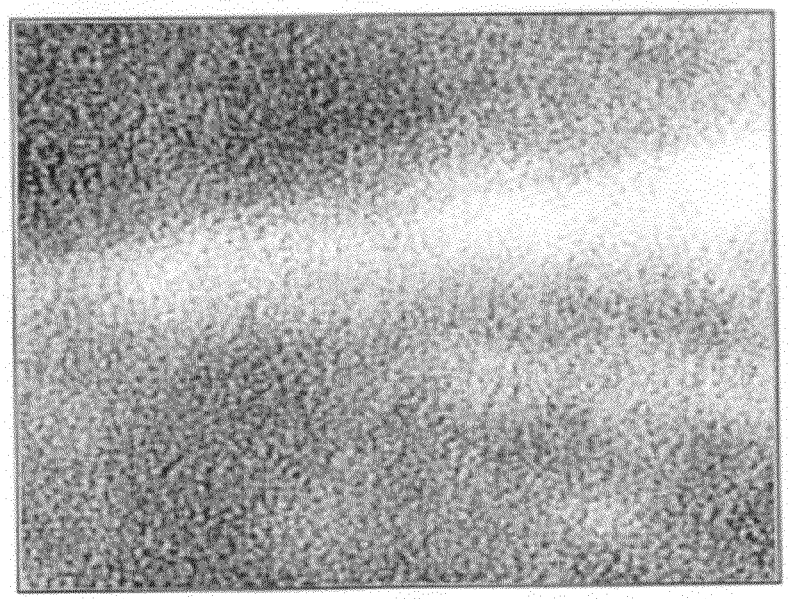
FIG. 3B is a photograph showing a cross-section of a PCM layer including antimony formed by performing 25 cycles of the above steps at a temperature of about 100° C.

FIG. 3A is a photograph showing a cross-section of a PCM layer including antimony formed by. performing 22 cycles of the above steps at a temperature of about 250° C. The surface of the PCM layer was very rough. FIG. 3B is a photograph showing a cross-section of a PCM layer including antimony formed by performing 25 cycles of the above steps at a temperature of about 100° C. The surface of the PCM layer was smooth.

As shown in FIGS. 3A and 3B, when the temperature of the chamber is more than about 150° C., the surface of the PCM layer is rough. However, when the temperature of the chamber is less than about 150° C., the surface of the PCM layer is smoother.

Figure 4:
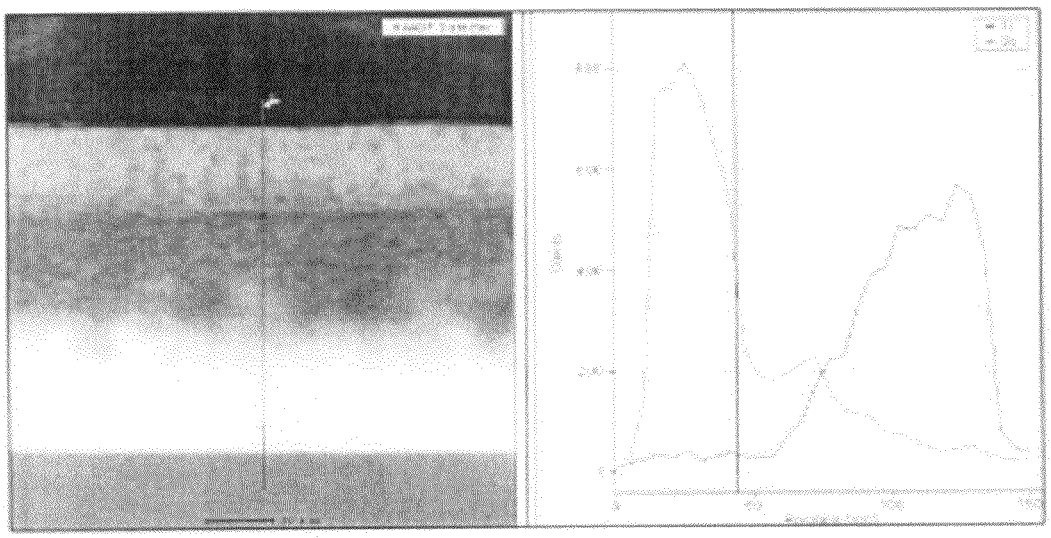

FIG. 4 is a photograph showing a cross-section of a porous insulation layer having phase-change nanowires including antimony therein, and a graph showing antimony and titanium in the porous insulation layer. Particularly, the photograph shows a layer structure including a silicon layer, a silicon oxide layer, a titanium nitride layer, an HSQ layer and an antimony layer sequentially stacked.

Referring to FIG. 4, antimony is uniformly distributed in the HSQ layer, i.e., the porous insulation layer to a depth of about 50 nm from a top surface thereof, and titanium is also distributed at a depth of about 100 to about 150 nm in the titanium nitride layer, i.e., a lower electrode. Thus, the phase-change nanowires including antimony may be uniformly formed through the porous insulation layer by the ALD process in accordance with example embodiments.

Figure 5:
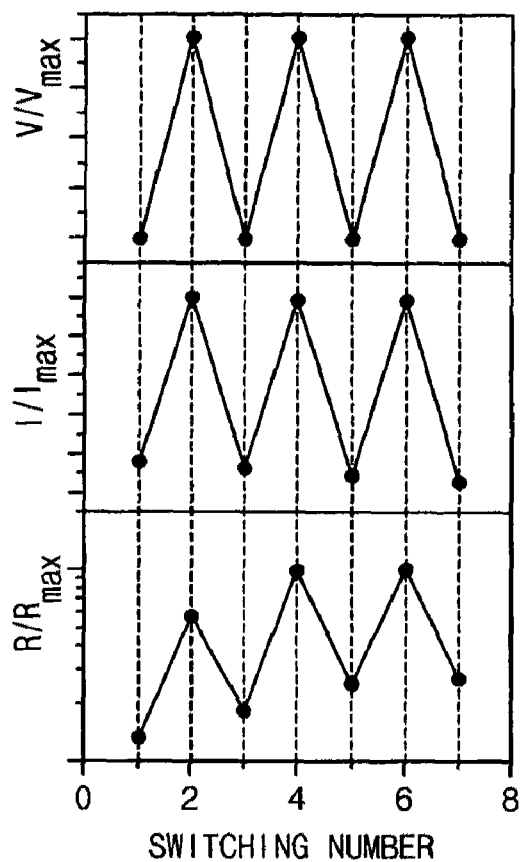

FIG. 5 is a graph showing changes of a resistance, a current and a voltage of the PRAM device including the phase-change nanowires when the phase of the phase-change nanowires is changed several times.

Referring to FIG. 5, a ratio of a reset resistance to a set resistance is more than about 10 at a reset current of about 1.5 mA, and the changes of the resistance, the current and the voltage are uniform. Thus, the PRAM device may have improved reliability.

Figure 6:
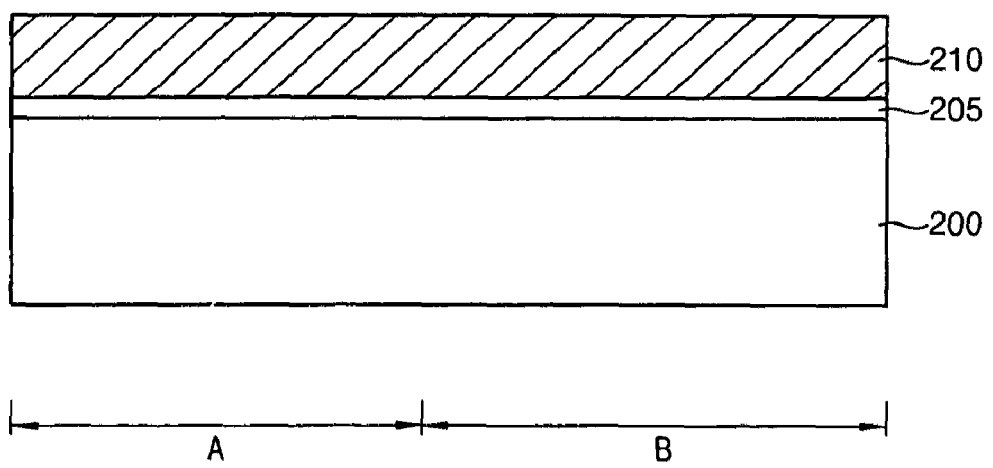

FIGS. 6 to 21 are cross-sectional views illustrating a method of manufacturing a PRAM device in accordance with example embodiments. Referring to FIG. 6, a pad oxide layer 205 and a pad nitride layer 210 may be sequentially formed on a substrate 200. The substrate 200 may be divided into a cell region A and a peripheral region B. In example embodiments, the pad oxide layer 205 may be formed to have a thickness of about 100 to about 150Å by a thermal oxidation process, and the pad nitride layer 210 may be formed to have a thickness of about 1,000 to about 1,100 Å by a chemical vapor deposition (CVD) process. In example embodiments, the pad nitride layer 210 may be formed by forming a first nitride layer (not shown) having a thickness of about 300 Å and forming a second nitride layer (not shown) having a thickness of about 700 to about 800 Å. The pad oxide layer 205 may absorb the stress of the pad nitride layer 210, and may protect the substrate 200 therefrom.

A hard mask layer (not shown) may be further formed on the pad nitride layer 210. In example embodiments, the hard mask layer may be formed to have a multi-stack structure. For example, an oxide layer or a nitride layer may be formed on the pad nitride layer 210, an organic layer may be formed on the oxide layer or the nitride layer, and an anti-reflective layer may be formed on the organic layer.

Figure 7:
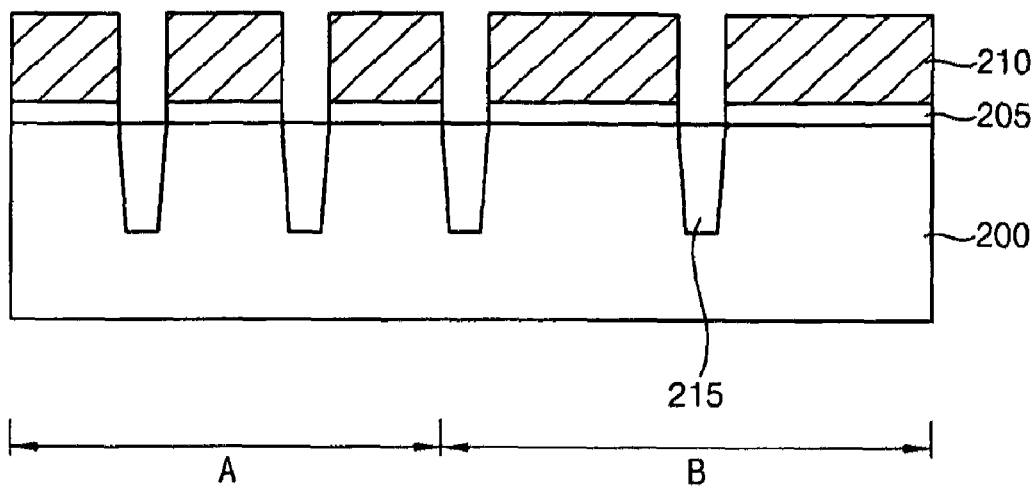

Referring to FIG. 7, a photoresist pattern (not shown) may be formed on the hard mask layer. The hard mask layer may be patterned using the photoresist pattern as an etching mask to form a hard mask (not shown). The photoresist pattern may be removed by an ashing process and/or an etch back process. The pad nitride layer 210 and the pad oxide layer 205 may be patterned using the hard mask. Upper portions of the substrate 200 may be removed using the pad nitride layer 210 and the pad oxide layer 205 as an etching mask to form a plurality of trenches (not shown). The trenches may be formed to have a depth of about 2000 to about 5000 Å. The trenches may be formed to have sidewalls angled with respect to a vertical direction, so that the stress of an isolation layer 215 filled into the trenches subsequently on the substrate 200 may be reduced. In example embodiments, some of the trenches in the cell region A may be less spaced apart from each other than those of the peripheral region B.

In example embodiments, the isolation layer 215 may be formed as follows. Particularly, exposed portions of the substrate 200 near the trenches may be thermally oxidized. A first oxide layer may be formed on inner walls of the trenches to have a thickness of about 100 Å using a middle temperature oxide (MTO). A second oxide layer may be formed on the first oxide layer to fill the remaining portions of the trenches using high density plasma chemical vapor deposition (HDP-CVD) oxide. After removing the hard mask, the pad nitride layer 210 and the pad oxide layer 205, an upper portion of the second oxide layer may be planarized until a top surface of the substrate 200 is exposed. Thus, the isolation layer 215 including the first and second oxide layers may be formed in the trenches.

In example embodiments, before forming the trenches, impurities may be implanted into the substrate 200 so that the isolation layer 215 may be isolated from active regions of the substrate 200 more clearly. Additionally, impurities may be implanted into the substrate 200 to form a well region or an impurity region therein (not shown).

Figure 8:
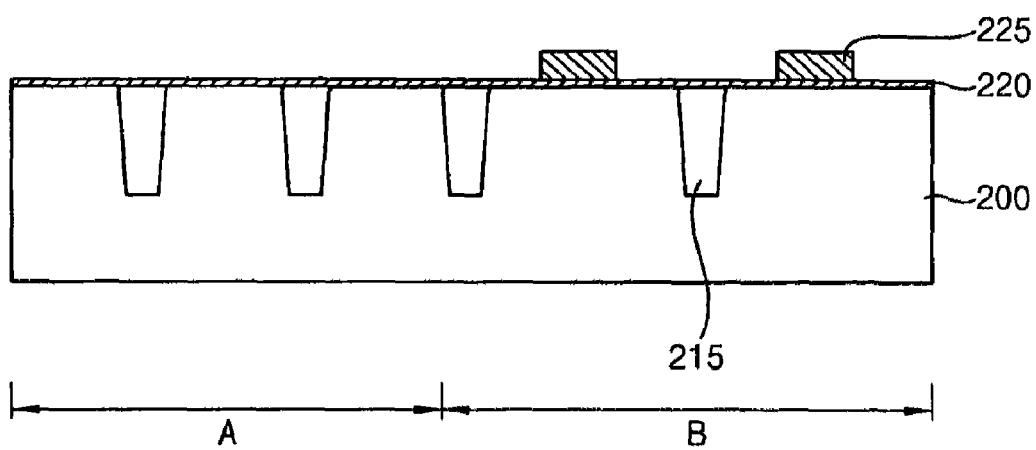

Referring to FIG. 8, a gate insulation layer 220 may be formed on the substrate 200 and the isolation layer 215. Gate electrodes 225 may be formed on the gate insulation layer 220 in the peripheral region B. First impurities may be implanted into the peripheral region B of the substrate 200 to form a first impurity region (not shown) at upper portions of the substrate 200 adjacent to the gate electrodes 225.

Figure 9:
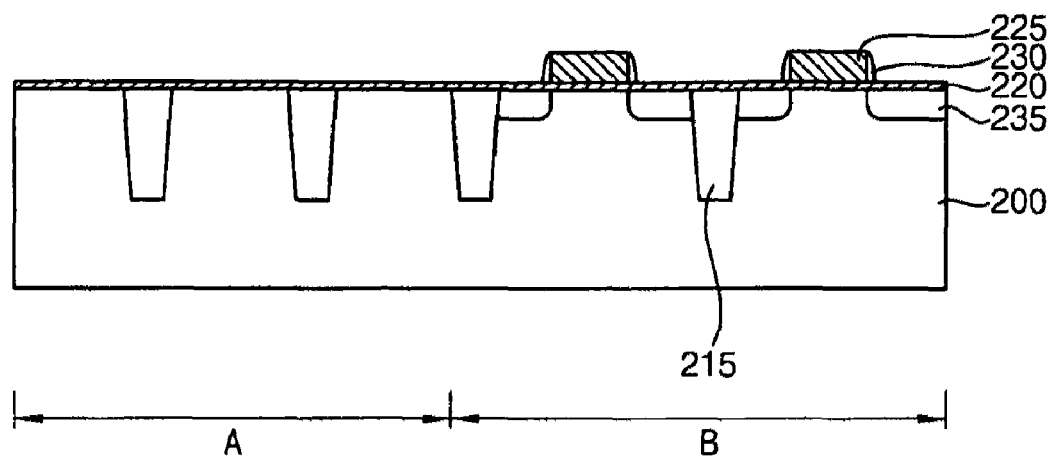

Referring to FIG. 9, gate spacers 230 may be formed on sidewalls of the gate electrodes 225. The gate spacers 230 may be formed using a nitride by a CVD process and an etch back process. First impurities may be lightly implanted into the peripheral region B of the substrate 200 using the gate electrodes 225 as an ion implantation mask to form first impurity regions (not shown) at upper portions of the substrate 200 adjacent to the gate electrodes 225. Gate spacers 230 may be formed on sidewalls of the gate electrodes 225. Second impurities may be heavily implanted into the peripheral region B of the substrate 200 using the gate electrodes 225 and the gate spacers 230 as an ion implantation mask to form second impurity regions (not shown) at upper portions of the substrate 200 adjacent to the gate electrodes 225. The first and second impurity regions may form source/drain regions 235 having a lightly doped drain (LDD) structure.

Figure 10:
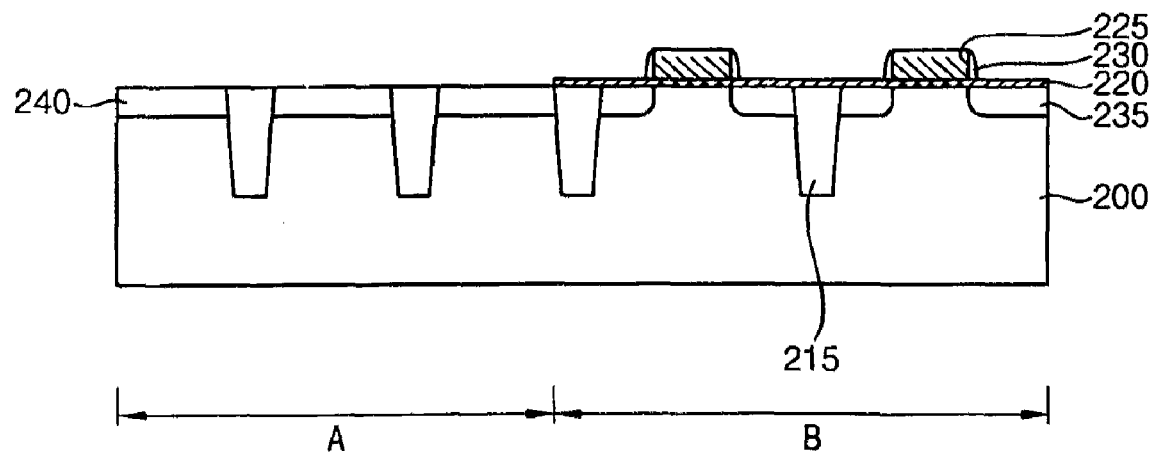

Referring to FIG. 10, a portion of the gate insulation layer 220 in the cell region A may be removed, and a mask (not shown) covering the peripheral region B may be formed on the substrate 200. A conductive layer 240 may be formed at an upper portion of the substrate 200 in the cell region A. In example embodiments, the conductive layer 240 may be formed by implanting impurities, e.g., n-type impurities, into the substrate 200. The conductive layer 240 may serve as a word line.

Figure 11:
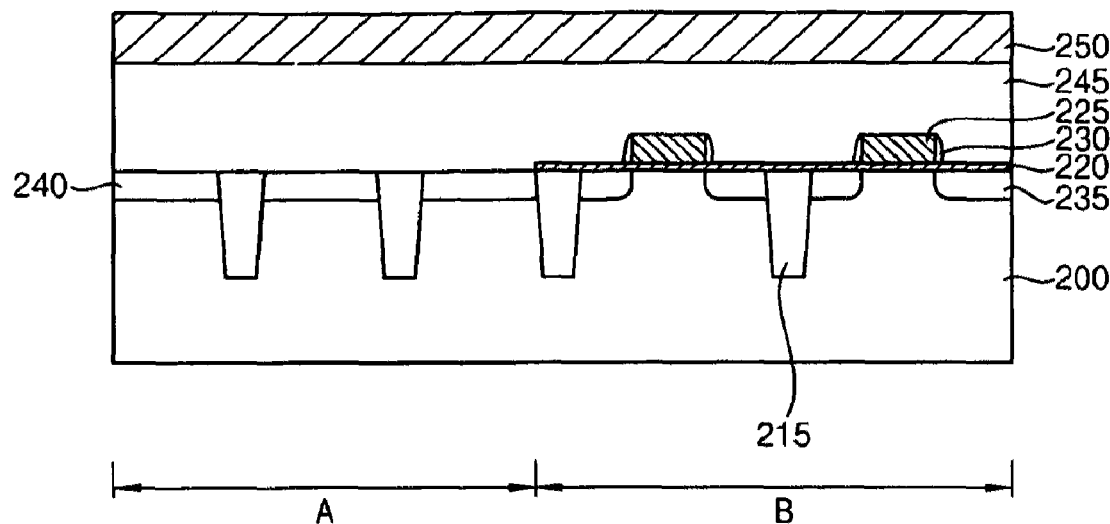

Referring to FIG. 11, a first insulating interlayer 245 and a second insulating interlayer 250 may be sequentially formed on the substrate 200 and the isolation layer 215 to cover the gate electrodes 225, the gate spacers 230, the gate insulation layer 220 and the conductive layer 240. The first and second insulating interlayers 245 and 250 may be formed using HDP-CVD oxide and a nitride, respectively. The first and second insulating interlayers 245 and 250 may be formed to have thicknesses of about 5000 Å and 1500 Å, respectively.

Figure 12:
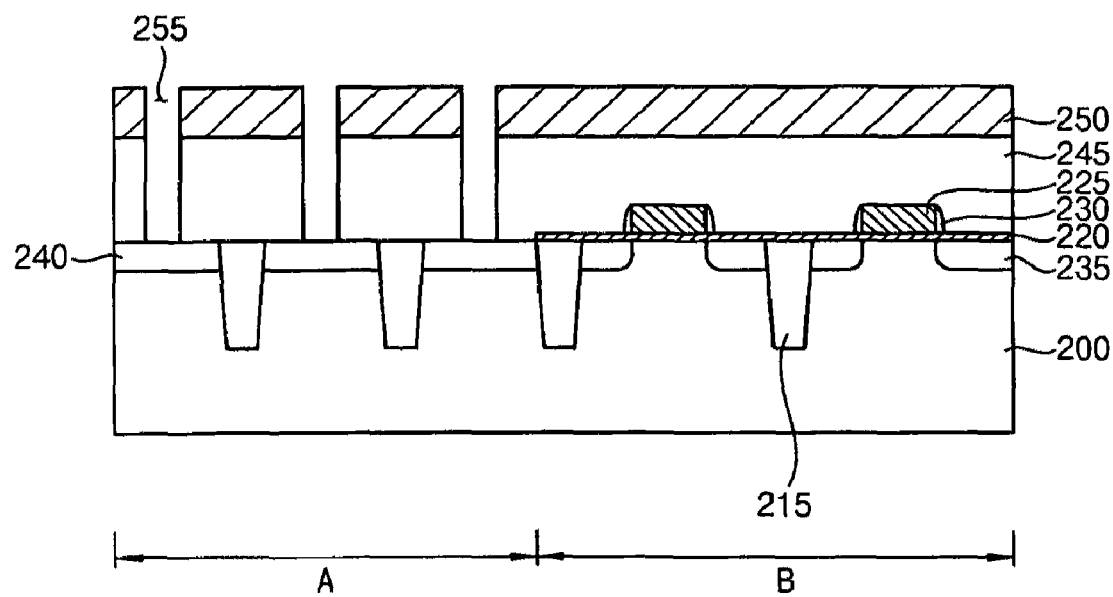

Referring to FIG. 12, openings 255 may be formed through the first and second insulating interlayers 245 and 250 to expose portions of the conductive layer 240. Spacers (not shown) may be further formed on sidewalls of the openings 255. A cleaning process may be further performed on the exposed portions of the conductive layer 240.

Figure 13:
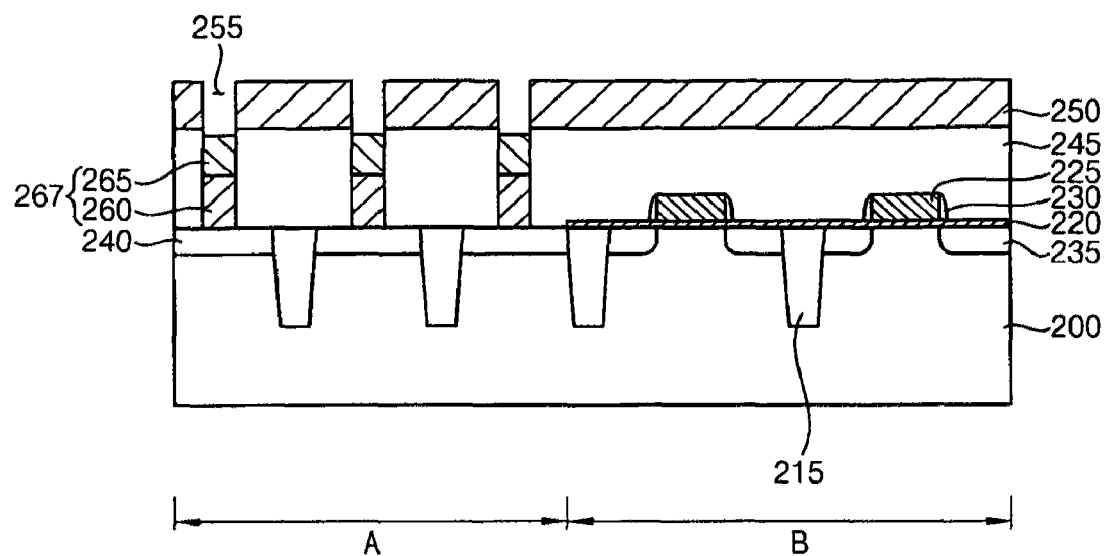

Referring to FIG. 13, a single crystalline silicon layer may be formed on the exposed portion of the conductive layer 240 in the openings 255 by an epitaxial growth process. In example embodiments, the single crystalline silicon layer may be grown to cover a top surface of the second insulating interlayer 250, and an upper portion of the single crystalline silicon layer may be planarized until the top surface of the conductive layer 240 is exposed.

Third and fourth impurities may be sequentially implanted into the single crystalline silicon layer to form a lower conductive layer 260 and an upper conductive layer 265, respectively. The lower and upper conductive layers 260 and 265 may form a diode 267. In example embodiments, the third and fourth impurities may include n-type impurities and p-type impurities, respectively. In example embodiments, an upper portion of the upper conductive layer 265 may be removed by an etch back process.

Figure 14:
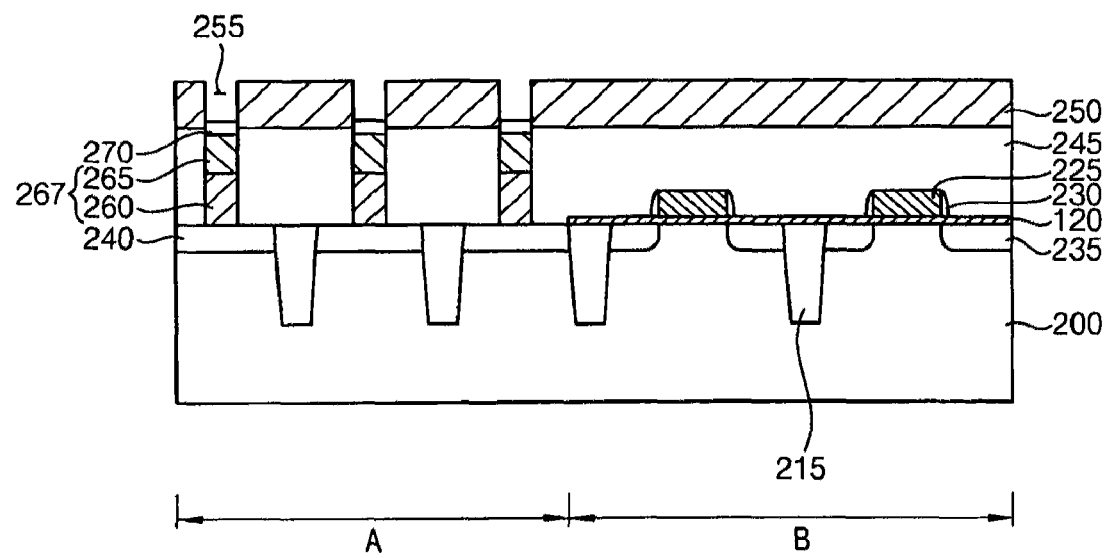

Referring to FIG. 14, a lower electrode 270 may be formed on the diode 267. The lower electrode 270 may be formed using a conductive material, e.g., titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and/or tantalum oxynitride, and/or a conductive carbon-based material. These may be used alone or in a combination thereof.

Figure 15:
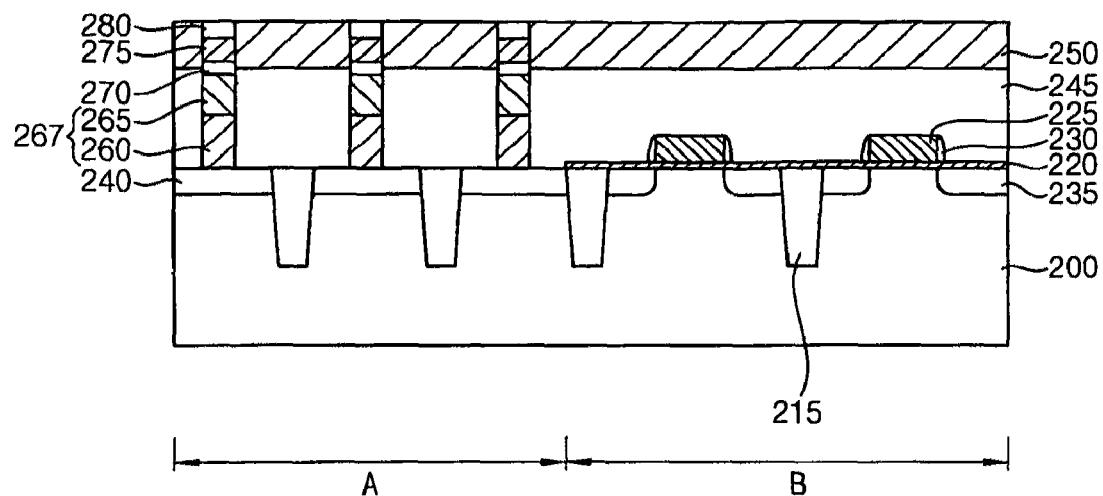

Referring to FIG. 15, a porous insulation layer 275 may be formed on the lower electrode 270. The porous insulation layer 275 may be formed using a silsesquioxane (SSQ)-based material, e.g., hydrogen silsesquioxane (HSQ), a polymer having a nonpolar carbon-carbon bond, or a silica-based material. The porous insulation layer 275 may be formed by a spin coating process, a CVD process, an ALD process or a PVD process. The porous insulation layer 275 may include a pore having a diameter of less than about 10 nm. In example embodiments, the pore in the porous insulation layer 275 may have a cross-section of about $1\times1$ nm$^2$ to about $5\times5$ nm$^2$.

A PCM layer 280 may be formed on the porous insulation layer 275 using antimony or bismuth by an ALD process. When the PCM layer 280 is formed, a phase-change nanowire (not shown) may be formed through the porous insulation layer 275, e.g., in the pore thereof. The phase-change nanowire may include a single element. For example, the phase-change nanowire may include antimony or bismuth. The phase-change nanowire may be formed through the porous insulation layer 275, and may be electrically connected to the lower electrode 270. Particularly, the phase-change nanowire may be formed in the pore of the porous insulation layer 275. The pore may have a relatively small cross-section, and thus, the phase-change nanowire may also have a relatively small cross-section, e.g., in a range of about $1\times1$ nm$^2$ to about $5\times5$ nm$^2$. As a result, the phase-change nanowire may have a relatively small contact area with the lower electrode 270, and thus, the PRAM device may have a relatively large current density flowing through the phase-change nanowire.

Figure 16:
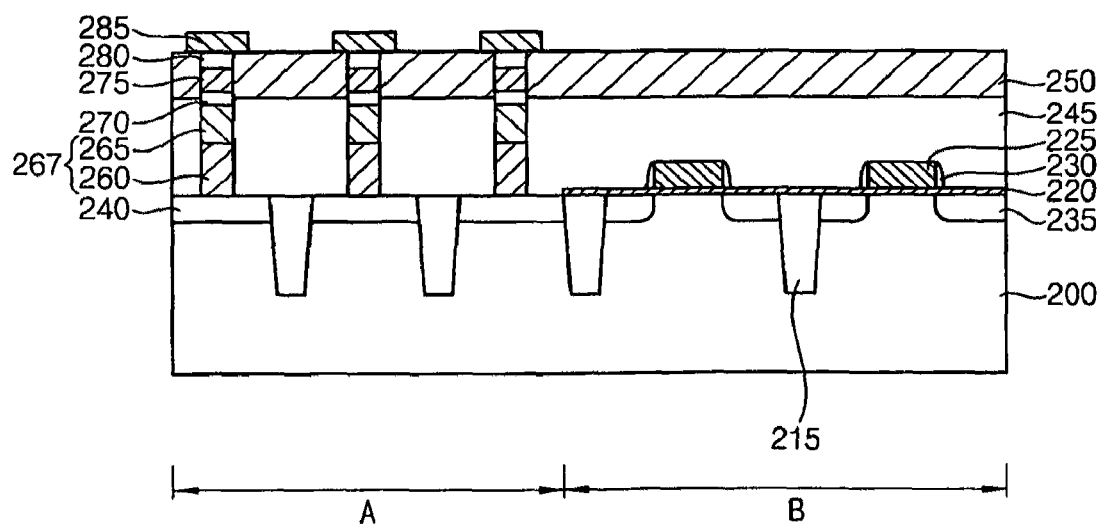

Referring to FIG. 16, an upper electrode 285 may be formed on the PCM layer 280 and the second insulating interlayer 250 to be electrically connected to the phase-change nanowire. The upper electrode 285 may be formed using a conductive material, e.g., titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and/or tantalum oxynitride, and/or a conductive carbon-based material. These may be used alone or in a combination thereof.

A capping layer (not shown) may be further formed on the upper electrode 285. The capping layer may be formed using a nitride and aluminum oxide. The capping layer may prevent or reduce impurities in a third insulating interlayer 290 subsequently formed from moving to the PCM layer 280.

Figure 17:
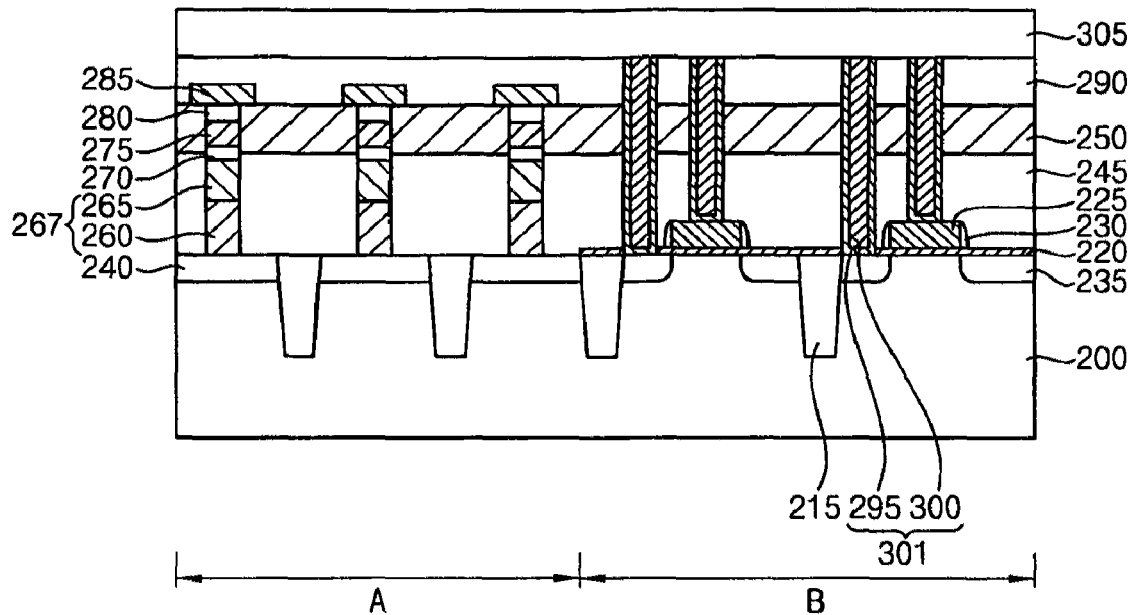

Referring to FIG. 17, the third insulating interlayer 290 may be formed on the second insulating interlayer 290 to cover the upper electrode 285. In example embodiments, the third insulating interlayer 290 may be formed using plasma-tetraethyl orthosilicate (P-TEOS) to have a thickness of about 3000 Å.

The first, second and third insulating interlayers 245, 250 and 290 and the gate insulation layer 220 may be partially removed to form first contact holes (not shown) therethrough. A first barrier layer 295 may be formed on inner walls of the first contact holes. The first barrier layer 295 may be formed using a metal or metal nitride, e.g., titanium, titanium nitride and/or titanium tungsten. A first metal layer 300 may be formed on the barrier layer 295 to fill the remaining portions of the first contact holes. In example embodiments, the first metal layer 300 may be formed using tungsten. The first barrier layer 295 and the first metal layer 300 may be referred to as a first contact plug 301. A fourth insulating interlayer 305 may be formed on the third insulating interlayer 290 and the first contact plug 301.

Figure 18:
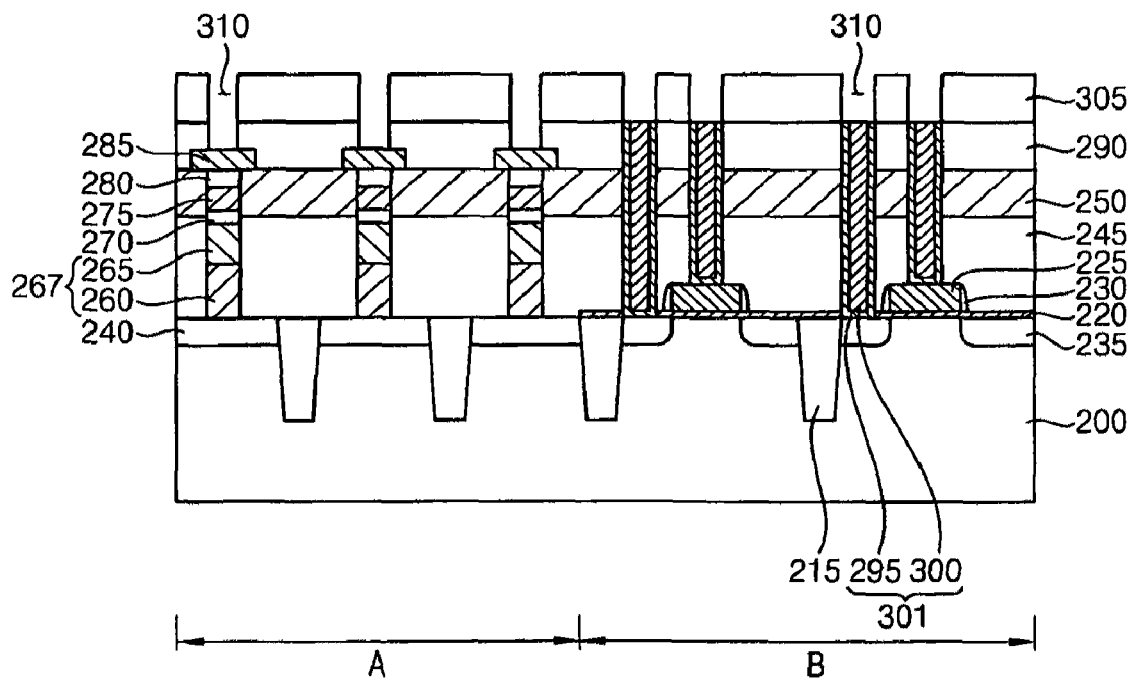

Referring to FIG. 18, second contact holes 310 may be formed through the fourth insulating interlayer 305 and the third insulating interlayer 290 to expose the first contact plug 301 and the upper electrode 285.

Figure 19:
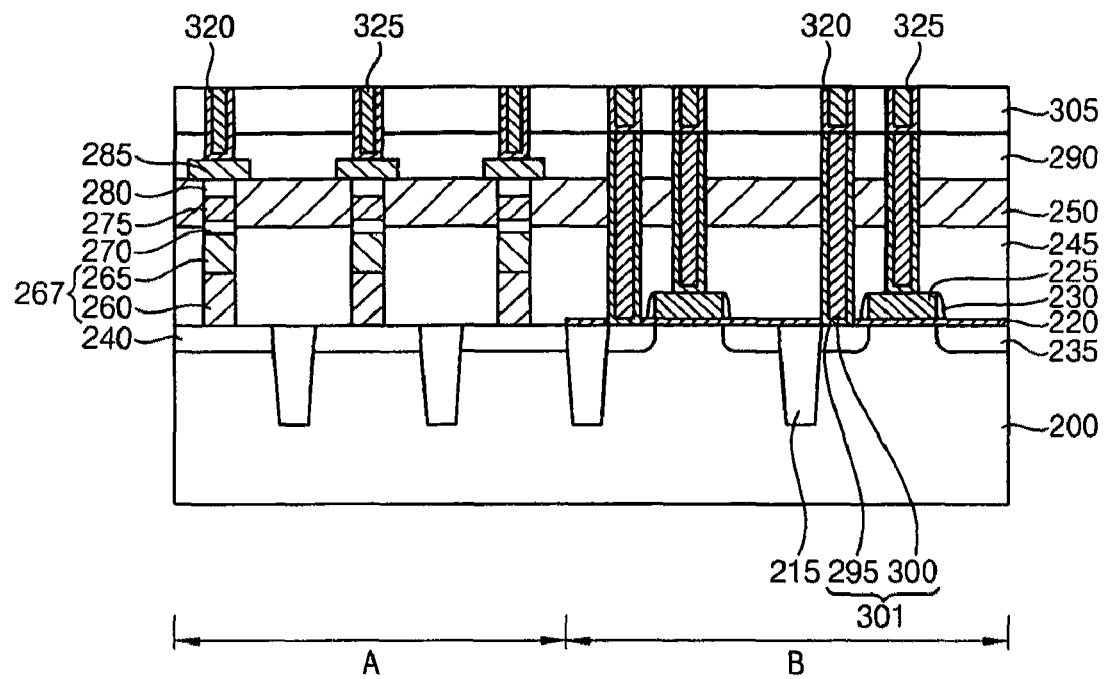

Referring to FIG. 19, a second barrier layer 320 may be formed on inner walls of the second contact holes. The second barrier layer 320 may be formed using a metal or metal nitride e.g., titanium, titanium nitride and/or titanium tungsten. A second metal layer 325 may be formed on the second barrier layer 320 to fill the remaining portions of the second contact holes 310. In example embodiments, the second metal layer 325 may be formed using tungsten. The second barrier layer 320 and the second metal layer 325 may be referred to as a second contact plug.

Figure 20:
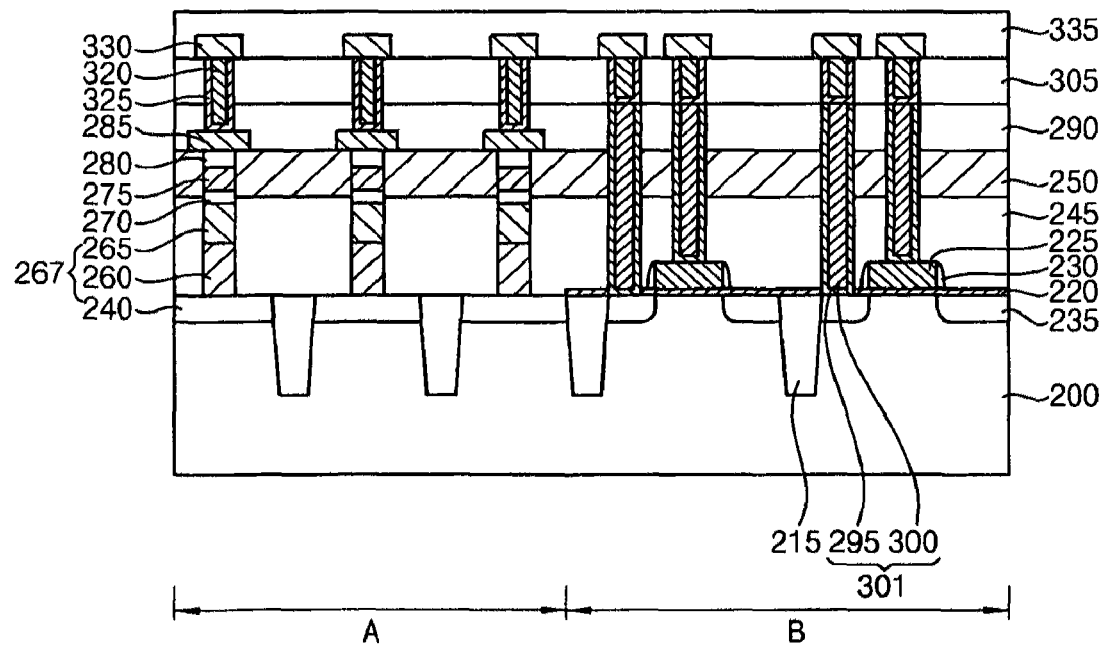

Referring to FIG. 20, a first wiring 330 may be formed on the second contact plug and the fourth insulating interlayer 305. The first wiring 330 may be formed using e.g., aluminum. In example embodiments, the first wiring 330 may be formed to have a multi-stack structure including a metal layer and a capping layer (not shown).

A fifth insulating interlayer 335 may be formed on the fourth insulating interlayer 305 to cover the first wiring 330. The fifth insulating interlayer 335 may be formed using HDP-CVD oxide and/or P-TEOS.

Figure 21:
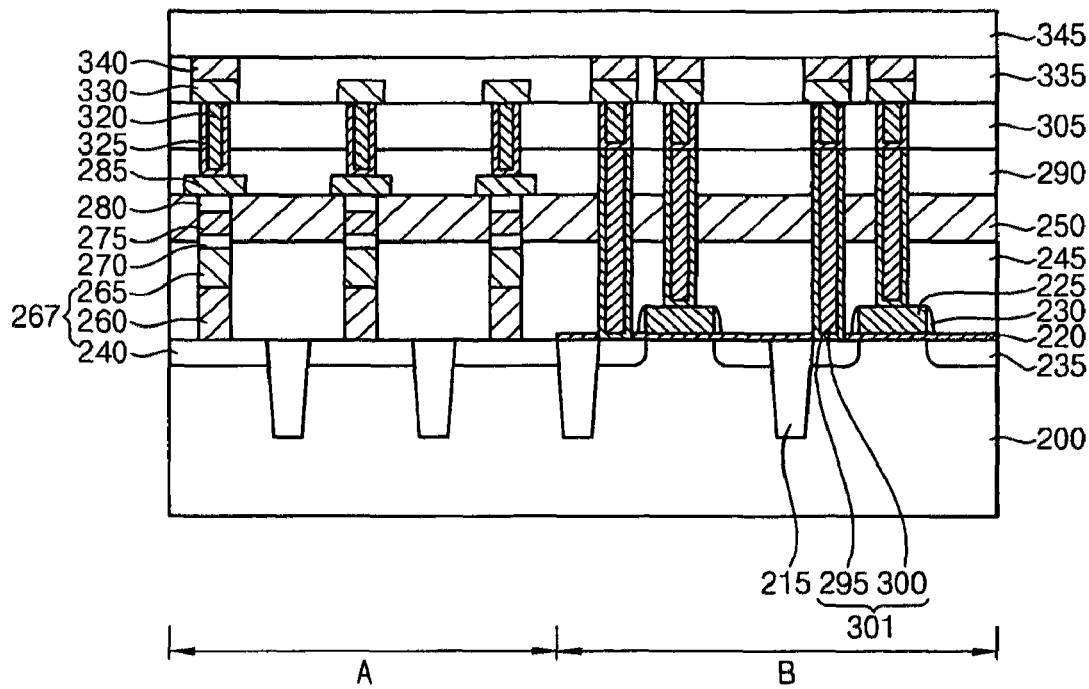

Referring to FIG. 21, a second wiring 340 may be formed through the fifth insulating interlayer 335 to be electrically connected to the first wiring 330. The second wiring 340 may be formed using a metal. A protection layer 345 may be formed on the fifth insulating interlayer 335 to cover the second wiring 340.

The phase-change nanowire and the PCM layer 280 may include the single element, and thus, some elements therein may not be segregated from other elements. Thus, no phase segregation may occur in the phase-change nanowire and the PCM layer 280, and the PRAM device may have improved reliability. Additionally, the phase-change nanowire may have a relatively small contact area with the lower electrode 270, and thus, a small current may be needed to operate the PRAM device. As a result, the PRAM device may have a higher operation speed.

Figure 22:
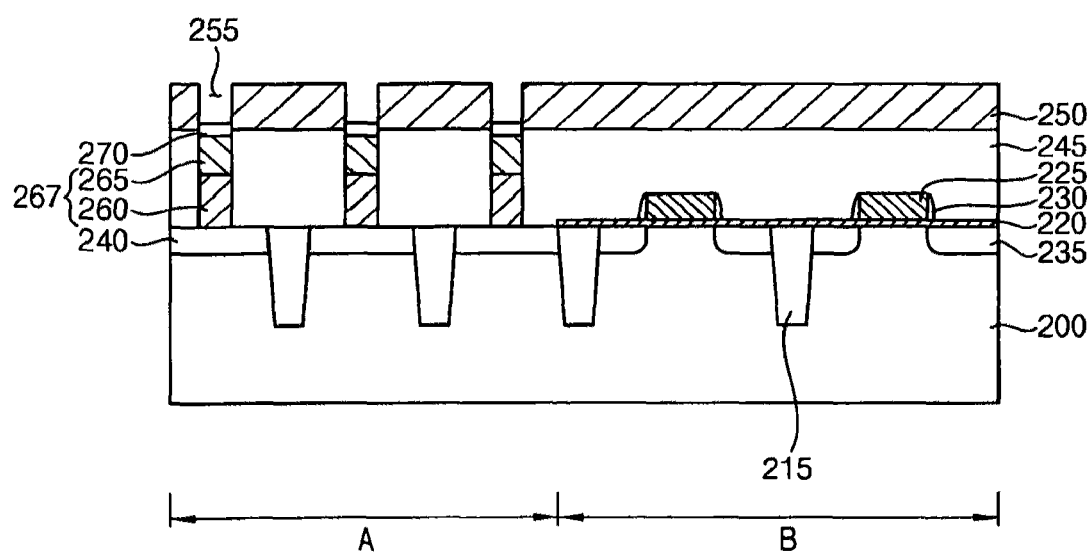
Figure 23:
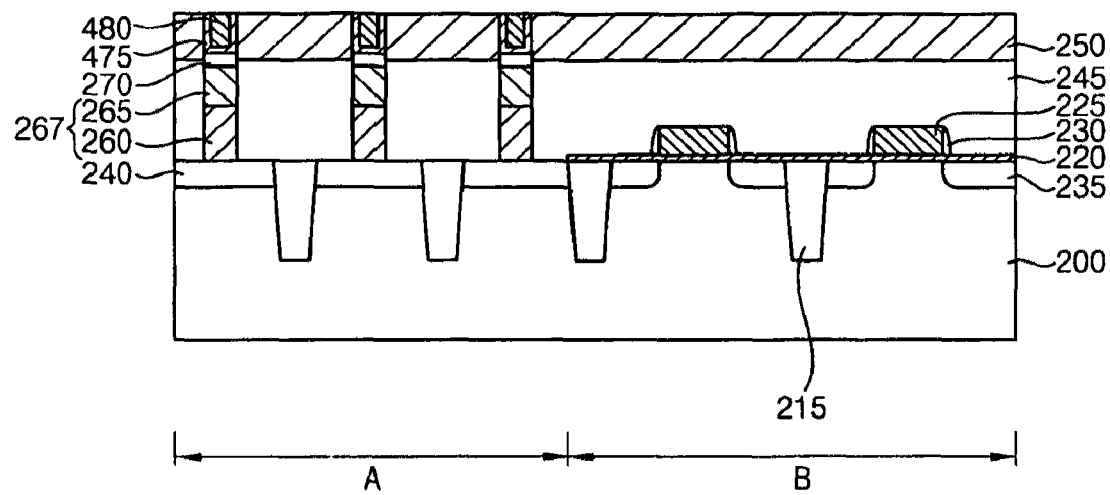
Figure 24:
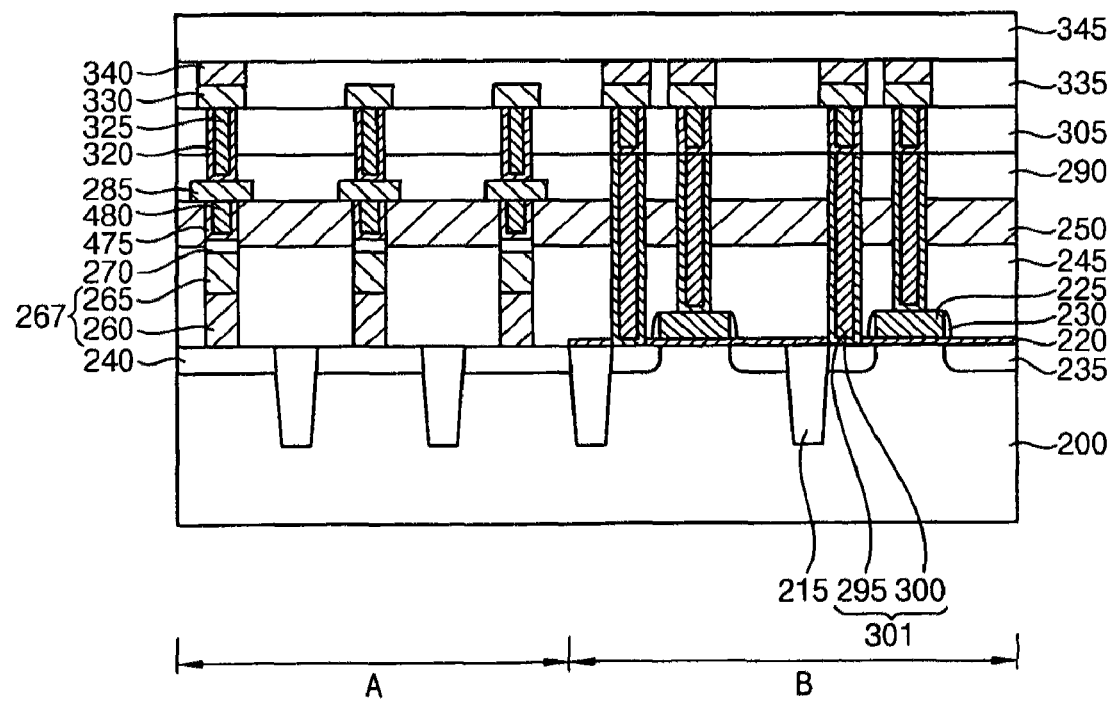

FIGS. 22 to 24 are cross-sectional views illustrating a method of manufacturing a PRAM device in accordance with other example embodiments. The PRAM device of FIGS. 22 to 24 are substantially the same as that of FIGS. 6 to 21 except for the shape of the porous insulation layer 275 and the PCM layer 280. Thus, like numerals refer to like elements, and repetitive explanations are omitted here. Referring to FIG. 22, processes substantially the same as those illustrated with reference to FIGS. 6 to 14 may be performed to form the structure of FIG. 22.

Referring to FIG. 23, a porous insulation layer 475 may be formed conformally on the lower electrode 270 and inner walls of the openings 255. A PCM layer 480 may be formed on the porous insulation layer 475 to fill the remaining portions of the openings 255. When the PCM layer 480 is formed, a phase-change nanowire (not shown) may be formed through the porous insulation layer 475. Referring to FIG. 24, processes substantially the same as those illustrated with reference to FIGS. 16 to 21 may be performed to form the structure of FIG. 24.

Figure 25:
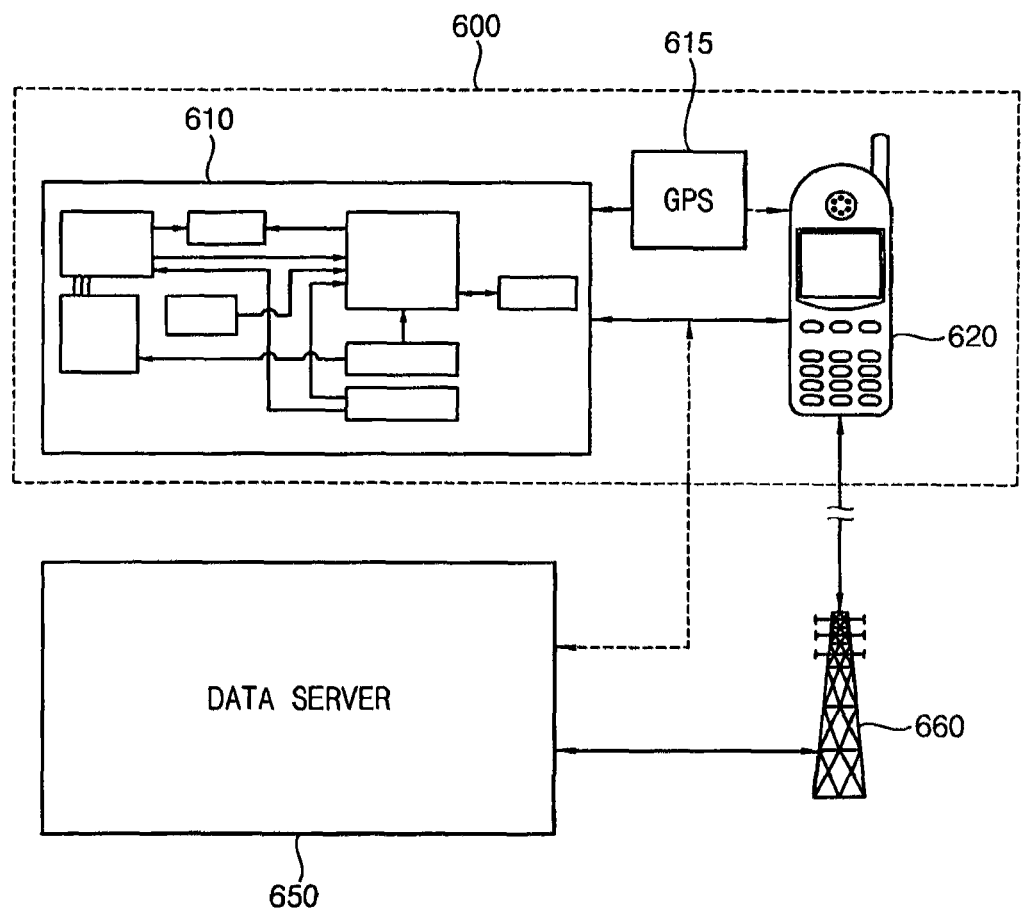

FIG. 25 is a diagram illustrating a communication system including the PRAM device in accordance with example embodiments. Referring to FIG. 25, a communication system 600 may include a sensor module 610, a global positioning system (GPS) 615 and a cellular phone 620. In the communication system 600, the sensor module 610, the GPS 615 and the cellular phone 620 may transfer data to each other, and the communication system 600 may transfer data with the data server 650 and the base station 660. The cellular phone 620 may include the PRAM device having an improved reliability and a higher operation speed, and thus, the communication system 600 may operate efficiently.

According to example embodiments, a PRAM device may include a phase-change nanowire having a single element, and thus, some elements therein may not be segregated from other elements. Thus, no phase segregation may occur in the phase-change nanowire, and the PRAM device may have improved reliability. Additionally, the phase-change nanowire may have a relatively small contact area with a lower electrode, and thus, a smaller current may be needed to operate the PRAM device. As a result, the PRAM device may have a higher operation speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a phase-change random access memory (PRAM) device, comprising:
   forming a lower electrode through an insulating layer;
   forming a phase-change nanowire to be electrically connected to the lower electrode using a single element; and
   forming an upper electrode electrically connected to the phase-change nanowire.

2. The method of claim 1, wherein forming the phase-change nanowire includes:
   forming a porous insulation layer on the lower electrode; and
   forming the phase-change nanowire in a pore of the porous insulation layer having a cross-section in a range of about $1 \times 1$ nm$^2$ to about $5 \times 5$ nm$^2$.

3. The method of claim 2, wherein forming the phase-change nanowire includes performing an atomic layer deposition (ALD) process on the porous insulation layer using the single element.

4. The method of claim 3, wherein the ALD process is performed using antimony or bismuth.

5. The method of claim 4, wherein the ALD process is performed using Sb-(iPr)$_3$ as a precursor source gas.

6. The method of claim 3, wherein the ALD process is performed using argon plasma.

7. The method of claim 2, further comprising:
   forming a phase-change material (PCM) layer between the porous insulation layer and the upper electrode.

8. The method of claim 7, wherein the PCM layer is formed integrally with the phase-change nanowire and includes the same material as that of the phase-change nanowire.

9. The method of claim 2, wherein forming the porous insulation layer includes forming any one selected from the group consisting of a silsesquioxane (SSQ)-based material, a polymer having a nonpolar carbon-carbon bond, and a silica-based material.

10. The method of claim 9, wherein the SSQ-based material includes hydrogen silsesquioxane (HSQ).

11. The method of claim 1, further comprising:
    forming a diode to be electrically connected to the lower electrode.

12. The method of claim 1, wherein the phase-change nanowire is formed to have a diameter of less than about 10 nm.

13. The method of claim 1, wherein forming the lower and upper electrodes include forming at least one of a conductive material and a conductive carbon-based material.

14. The method of claim 13, wherein the conductive material is at least one of titanium, tantalum, tungsten, molybdenum, niobium, titanium nitride, tantalum nitride, tungsten nitride, molybdenum nitride, niobium nitride, molybdenum aluminum nitride, tungsten boron nitride, titanium oxynitride, tungsten oxynitride and tantalum oxynitride.

* * * * *